United States Patent
Lee et al.

(10) Patent No.: US 10,141,043 B1
(45) Date of Patent: Nov. 27, 2018

(54) DRAM AND METHOD FOR MANAGING POWER THEREOF

(71) Applicant: NANYA TECHNOLOGY CORPORATION, New Taipei (TW)

(72) Inventors: Chung-Hsun Lee, New Taipei (TW); Hsien-Wen Liu, Luzhu Township, Taoyuan County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/657,592

(22) Filed: Jul. 24, 2017

(51) Int. Cl.
  *G11C 11/4074* (2006.01)
  *G11C 11/408* (2006.01)
(52) U.S. Cl.
  CPC ........ *G11C 11/4074* (2013.01); *G11C 11/408* (2013.01)
(58) Field of Classification Search
  CPC .................................. G11C 5/147; G11C 5/14
  USPC .......................................................... 365/226
  See application file for complete search history.

(56) References Cited

U.S. PATENT DOCUMENTS

| | | | |
|---|---|---|---|
| 6,356,500 B1 * | 3/2002 | Cloud | G11C 5/14 365/226 |
| 7,840,821 B2 * | 11/2010 | Krishnan | G06F 1/3203 713/300 |
| 2014/0208156 A1 | 7/2014 | Muralimanohar et al. | |

* cited by examiner

*Primary Examiner* — Haoi V Ho
*Assistant Examiner* — Minh Dinh
(74) *Attorney, Agent, or Firm* — Muncy, Geissler, Olds & Lowe, P.C.

(57) ABSTRACT

The present disclosure provides a dynamic random access memory (DRAM). The DRAM includes a plurality of banks, a power source and a control device. Each of the banks includes a plurality of subarrays. The control device derives information on a quantity of operated subarrays among the subarrays, and determines how much electrical energy to provide based on the information. The power source provides the resultant amount of electrical energy based on the determination from the control device.

18 Claims, 13 Drawing Sheets

DRAM AND METHOD FOR MANAGING POWER THEREOF

TECHNICAL FIELD

The present disclosure relates to a dynamic random access memory (DRAM), and more particularly, to a power management method of a DRAM.

DISCUSSION OF THE BACKGROUND

Semiconductor memory devices, for example, dynamic random access memory (DRAM) store data in an array of memory cells. The memory cells are typically arranged in rows and columns. The memory cells in a row are connected together to a word line, and the memory cells in a column are connected together to a bit line. The DRAM also contains many circuits that need more than one voltage for operation. A charge pump is installed into the DRAM, and can be used to generate and stabilize the internal supply voltage of the DRAM from an external voltage supply.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a DRAM. The DRAM includes a plurality of banks, a power source and a control device. Each of the banks includes a plurality of subarrays. The control device derives information on a quantity of operated subarrays among the subarrays, and determines an amount of electrical energy to provide based on the information. The power source provides the resultant amount of electrical energy based on the determination from the control device.

In some embodiments, the control device determines to provide a first amount of electrical energy when a quantity ratio of the operated subarrays is greater than a highest endpoint of a ratio range, and provide a second amount of electrical energy less than the first amount of electrical energy when the quantity ratio of the operated subarrays is less than a lowest endpoint of the ratio range.

In some embodiments, the control device determines to provide a third amount of electrical energy greater than the second amount of electrical energy and less than the first amount of electrical energy when the quantity ratio of the operated subarrays is less than the highest endpoint of the ratio range and greater than the lowest endpoint of the ratio range.

In some embodiments, the power source includes a plurality of charge pumps independent of each other. The control device increases a quantity of enabled charge pumps among the charge pumps when the control device determines to provide the first amount of electrical energy.

In some embodiments, the power source includes a plurality of charge pumps independent of each other. The control device decreases a quantity of enabled charge pumps among the charge pumps when the control device determines to provide the second amount of electrical energy.

In some embodiments, the control device receives a plurality of addresses, each of which indicates which subarray operates. The control device is configured to derive the information on the quantity of the operated subarrays based on the addresses.

In some embodiments, the DRAM further includes a counter.

The counter is configured to count a quantity of the addresses of the operated subarrays. The control device derives the information on the amount of the operated subarrays based on the quantity from the counter.

In some embodiments, the DRAM includes a distribution device. The distribution device is configured to distribute the resultant amount of electrical energy to the banks including the operated subarrays in a manner that the distributed electrical energy to the banks including the operated subarrays and the quantity of the operated subarrays have positive correlation.

In some embodiments, the control device includes a table configured to record the addresses, and the distribution device distributes the resultant amount of electrical energy based on the addresses recorded in the table.

In some embodiments, the control device includes a combinational logic.

In some embodiments, when each the charge pumps is enabled, each the charge pumps provides the same amount of electrical energy.

Another aspect of the present disclosure provides a method. The method includes providing a plurality of banks, each of the banks including a plurality of subarrays; deriving information on a quantity of operated subarrays among the subarrays; determining an amount of electrical energy to provide based on the information; and providing the resultant amount of electrical energy based on the determination.

In some embodiments, the determining the amount of electrical energy to provide based on the information includes determining to provide a first amount of electrical energy when a quantity ratio of the operated subarrays is greater than a highest endpoint of a ratio range; and determining to provide a second amount of electrical energy less than the first amount of electrical energy when the quantity ratio of the operated subarrays is less than a lowest endpoint of the ratio range.

In some embodiments, the determining the amount of electrical energy to provide based on the information includes determining to provide a third amount of electrical energy greater than the second amount of electrical energy and less than the first amount of is electrical energy when the quantity ratio of the operated subarrays is less than the highest endpoint of the ratio range and greater than the lowest endpoint of the ratio range.

In some embodiments, the method further includes providing a plurality of charge pumps. The determining to provide the first amount of electrical energy when the quantity ratio of the operated subarrays is greater than the highest endpoint of a ratio range includes determining to increase a quantity of enabled charge pumps among the charge pumps.

In some embodiments, the method further includes providing a plurality of charge pumps. The determining to provide the second amount of electrical energy less than the first amount of electrical energy when the quantity ratio of the operated subarrays is less than a lowest endpoint of the ratio range includes determining to decrease a quantity of enabled charge pumps among the charge pumps.

In some embodiments, the method further includes receiving a plurality of addresses, each of which indicates which subarray operates. The deriving information on the quantity of operated subarrays among the subarrays includes deriving the information on the quantity of the operated subarrays based on the addresses.

In some embodiments, the method further includes counting a number of the addresses of the operated subarrays. The deriving the information on the quantity of the operated subarrays based on the addresses includes deriving the information on the quantity of the operated subarrays based on the number.

In some embodiments, the method further includes distributing the resultant amount of electrical energy to the banks including the operated subarrays in a manner that the distributed electrical energy to the banks including the operated subarrays and the quantity of the operated subarrays have positive correlation.

In some embodiments, the method further includes recording the addresses. The distributing the resultant amount of electrical energy to the banks including the operated subarrays includes distributing the resultant amount of electrical energy based on the addresses recorded.

In the present disclosure, a control device of the DRAM of the present disclosure functions to derive information on a quantity of operated subarrays. Moreover, the control device determines how much electrical energy to provide based on the information. As such, an amount of electrical energy provided by a power source of the DRAM is adjustable and therefore can be managed. As a result, the DRAM is able to provide a function of power management, and usage of electrical energy is relatively efficient. In particular, when a quantity of operated subarrays of the DRAM is relatively low, the power source can provide a relatively low amount of electrical energy. The usage of electrical energy is relatively efficient.

In contrast, in a comparative DRAM, an enable device of the DRAM is unable to derive information on a quantity of operated subarrays. Further, the enable device is unable to determine how much electrical energy to provide based on the information. Therefore, an amount of electrical energy provided by all charge pumps of the DRAM is non-adjustable and therefore cannot be managed. As a result, the DRAM is unable to provide a function of power management, and usage of electrical energy is relatively inefficient. In particular, in a circumstance where one or more of subarrays are not operated, a power source of the DRAM still provides the same electrical energy as that provided in a circumstance where all the subarrays are operated. That is, the power source provides a greater amount of electrical energy than the memory requires. The usage of electrical energy is relatively inefficient.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
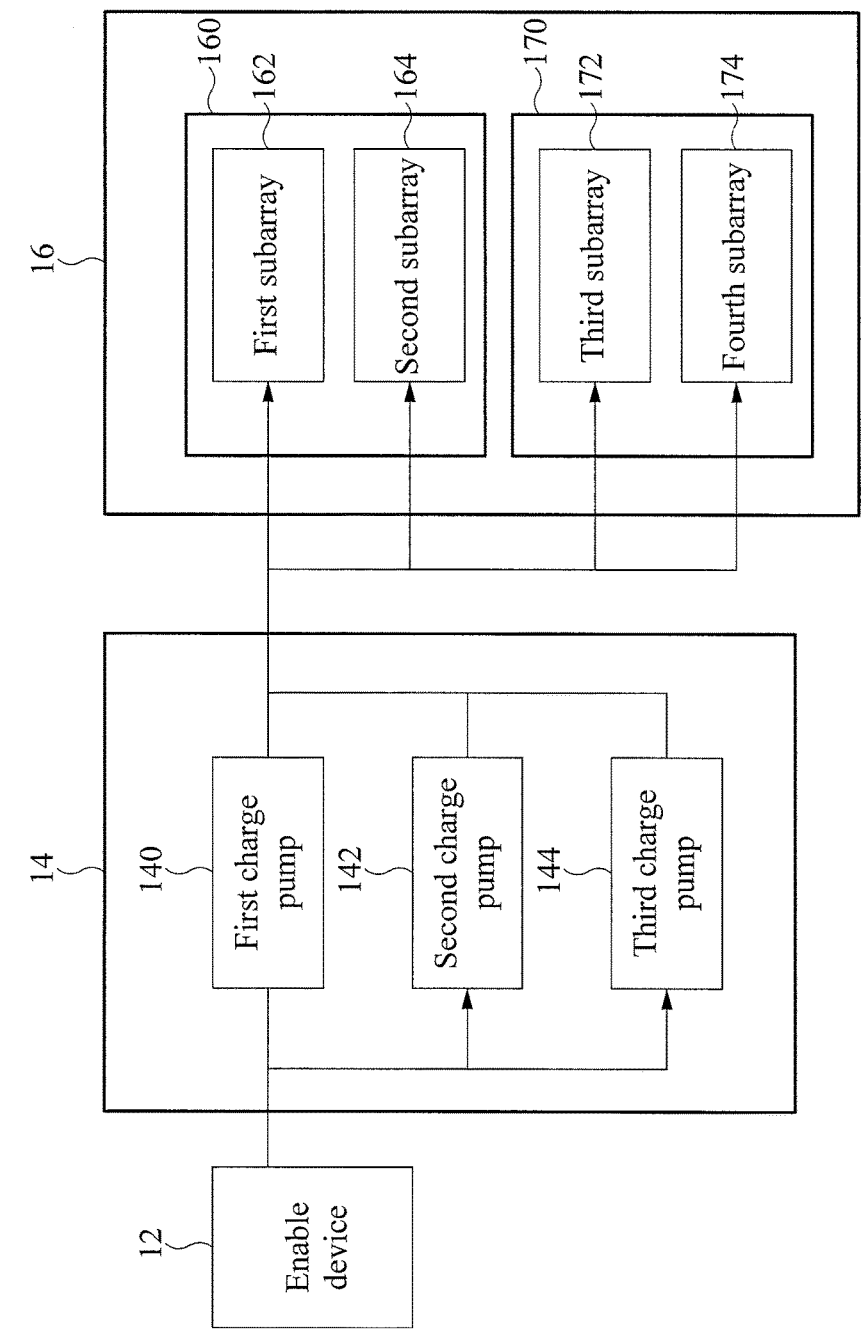
FIG. 1 is a schematic diagram of a comparative dynamic random access memory (DRAM), which includes an enable device.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a comparative dynamic random access memory (DRAM) 10, which includes an enable device 12. Referring to FIG. 1, in addition to the enable device 12, the DRAM 10 further includes a power source 14 and a memory 16.

The memory 16 functions to store data. The memory 16 includes a first bank 160 and a second bank 170, each of which being able to be deemed as an array of memory cells. The first bank 160 includes a first subarray 162 and a second subarray 164. Each of the first subarray 162 and the second subarray 164 includes one or more word lines. The second bank 170 includes a third subarray 172 and a fourth subarray 174. Each of the third subarray 172 and the fourth subarray 174 includes one or more word lines.

The power source 14 functions to provide the memory 16 with an amount of electrical energy sufficient to allow the memory 16 to work when being enabled. The power source 14 includes a first charge pump 140, a second charge pump 142, and a third charge pump 144 independent of each other. In some embodiments, when each of the first charge pump 140, the second charge pump 142 and the third charge pump 144 is enabled, each of the first charge pump 140, the second charge pump 142 and the third charge pump 144 provides the same amount of electrical energy. However, the present disclosure is not limited thereto.

The enable device 12 is only able to operate all of the first charge pump 140, the second charge pump 142 and the third charge pump 144 in the same manner. In other words, the enable device 12 is unable to individually operate the first charge pump 140, the second charge pump 142 and the third charge pump 144 in different manners. For example, when the enable device 12 enables all of the first charge pump 140, the second charge pump 142 and the third charge pump 144, all the first charge pump 140, the second charge pump 142 and the third charge pump 144 are enabled and none of them is disabled. Such disadvantage may result from the limitation of the simple design of the enable device 12.

In further detail, the enable device 12 is unable to derive information on a quantity of operated subarrays among the first subarray 160, the second subarray 162, the third subarray 170 and the fourth subarray 172. Further, the enable device 12 is unable to determine how much electrical energy to provide based on the information. Therefore, the enable device 12 is forced to operate all of the first charge pump 140, the second charge pump 142 and the third charge pump 144 in the same manner. As such, an amount of electrical energy provided by all of the first charge pump 140, the second charge pump 142 and the third charge pump 144 is non-adjustable and therefore cannot be managed. As a result, the DRAM 10 is unable to provide a function of power management, and usage of electrical energy is relatively inefficient.

In particular, in a circumstance where one or more of the first subarray 160, the second subarray 162, the third subarray 170 and the fourth subarray 172 are not operated, the power source 14 still provides the same amount of electrical energy as in a circumstance where all of the first subarray 160, the second subarray 162, the third subarray 170 and the fourth subarray 172 are operated, which will be described in detail with reference to FIGS. 2 to 4. That is, the power source 14 provides a greater amount of electrical energy than the memory 16 requires. The usage of electrical energy is relatively inefficient.

Figure 2:
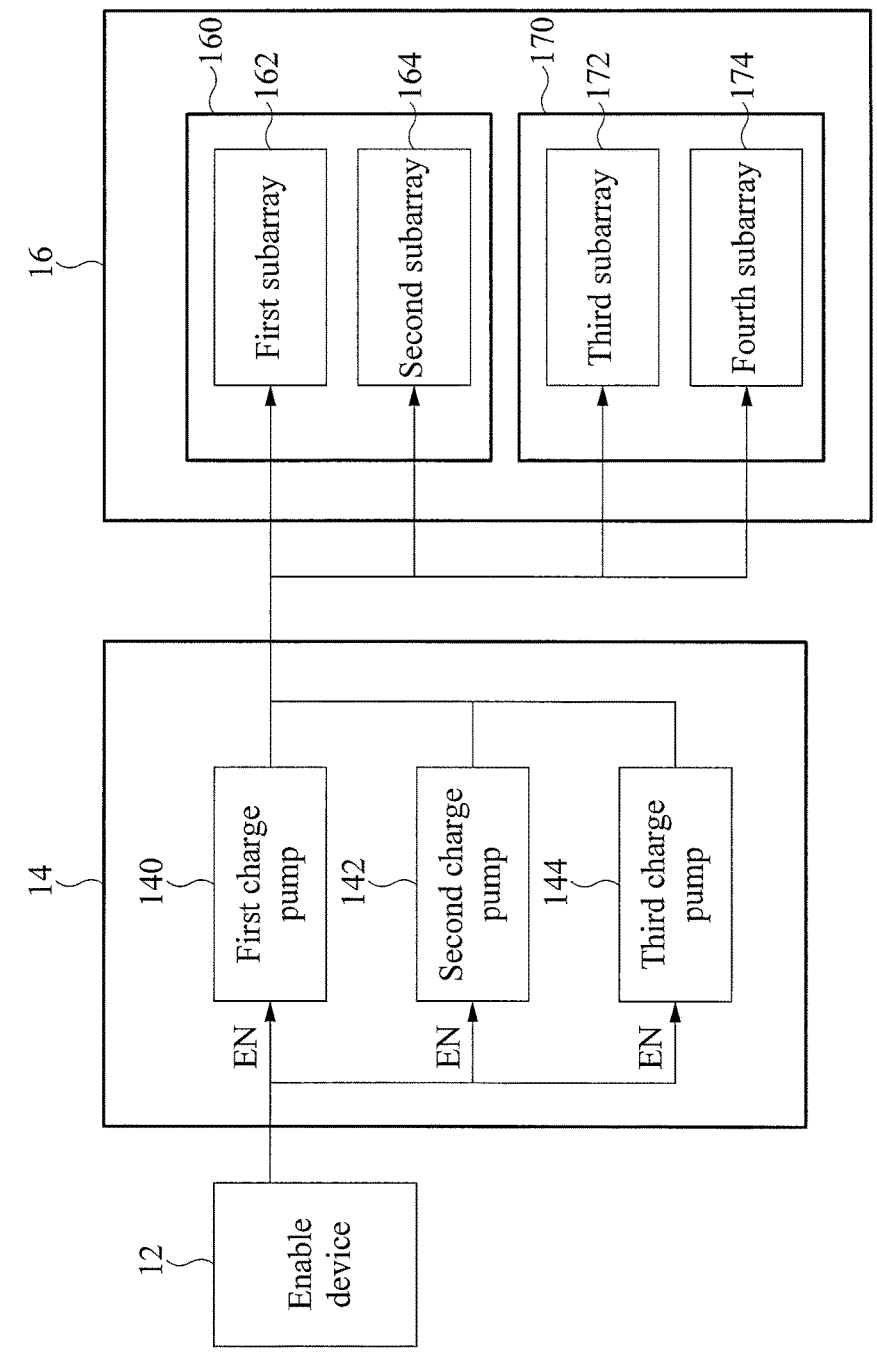
FIG. 2 is a schematic diagram illustrating an operation of the comparative DRAM shown in FIG. 1.

FIG. 2 is a schematic diagram illustrating an operation of the comparative DRAM 10 shown in FIG. 1. Referring to FIG. 2, the enable device 12 enables all of the first charge pump 140, the second charge pump 142 and the third charge pump 144, in response to an event that the memory 16 operates, by, for example, providing all of them with an enable signal EN. As such, all of the first charge pump 140, the second charge pump 142 and the third charge pump 144 are enabled and in combination provide the memory array 16 with electrical energy.

Figure 3:
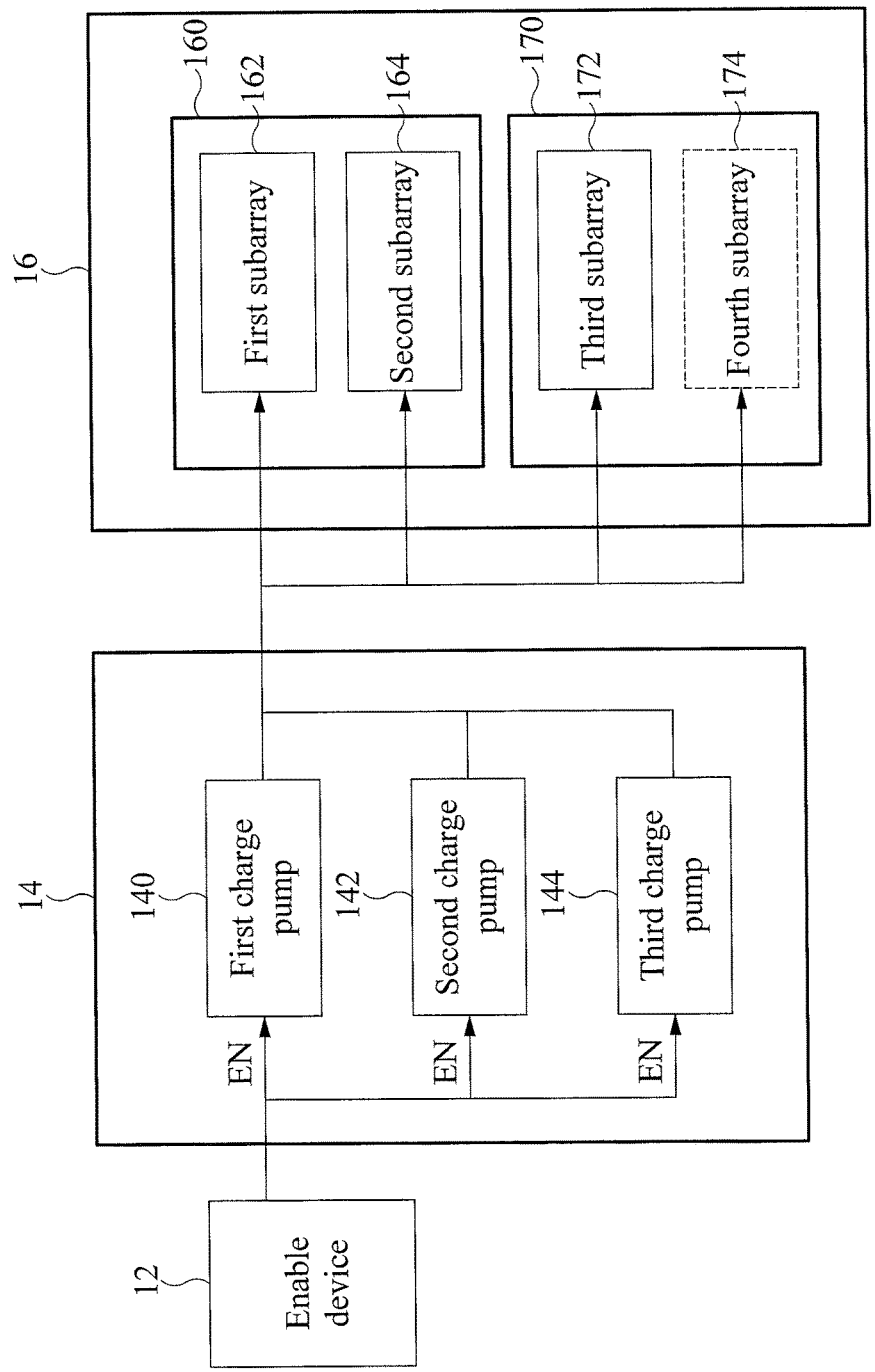
FIG. 3 is a schematic diagram illustrating another operation of the comparative DRAM shown in FIG. 1.

FIG. 3 is a schematic diagram illustrating another operation of the comparative DRAM 10 shown in FIG. 1. Referring to FIG. 3, the enable device 12 still enables all of the first charge pump 140, the second charge pump 142 and the third charge pump 144, in response to an event that the memory 16 operates, but the fourth subarray 174 is not operated. The enable device 12 causes the power source 14 to provide the same electrical energy as that provided in the embodiment of FIG. 2. The power source 14 provides a greater amount of electrical energy than the memory 16 requires. The usage of electrical energy is relatively inefficient.

Figure 4:
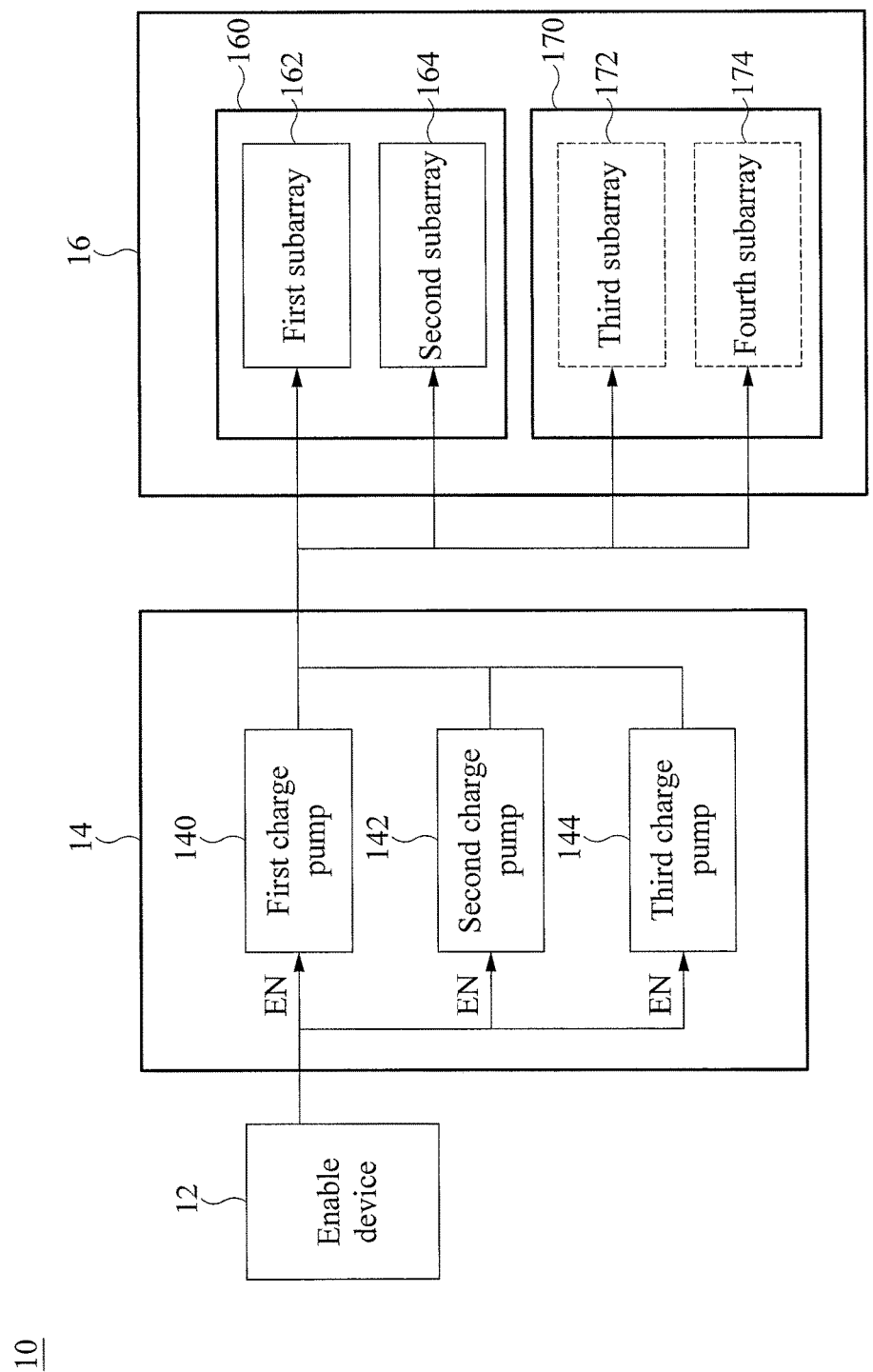
FIG. 4 is a schematic diagram illustrating yet another operation of the comparative DRAM shown in FIG. 1.

FIG. 4 is a schematic diagram illustrating yet another operation of the comparative DRAM 10 shown in FIG. 1. Referring to FIG. 4, the enable device 12 still enables all of the first charge pump 140, the second charge pump 142 and the third charge pump 144, in response to an event that the memory 16 operates, although neither the third subarray 172 nor the fourth subarray 174 is operated. The enable device 12 causes the power source 14 to provide the same amount of electrical energy as that provided in the embodiment of FIG. 2. The power source 14 provides a greater amount of electrical energy than the memory 16 requires. The usage of electrical energy is relatively inefficient.

Figure 5:
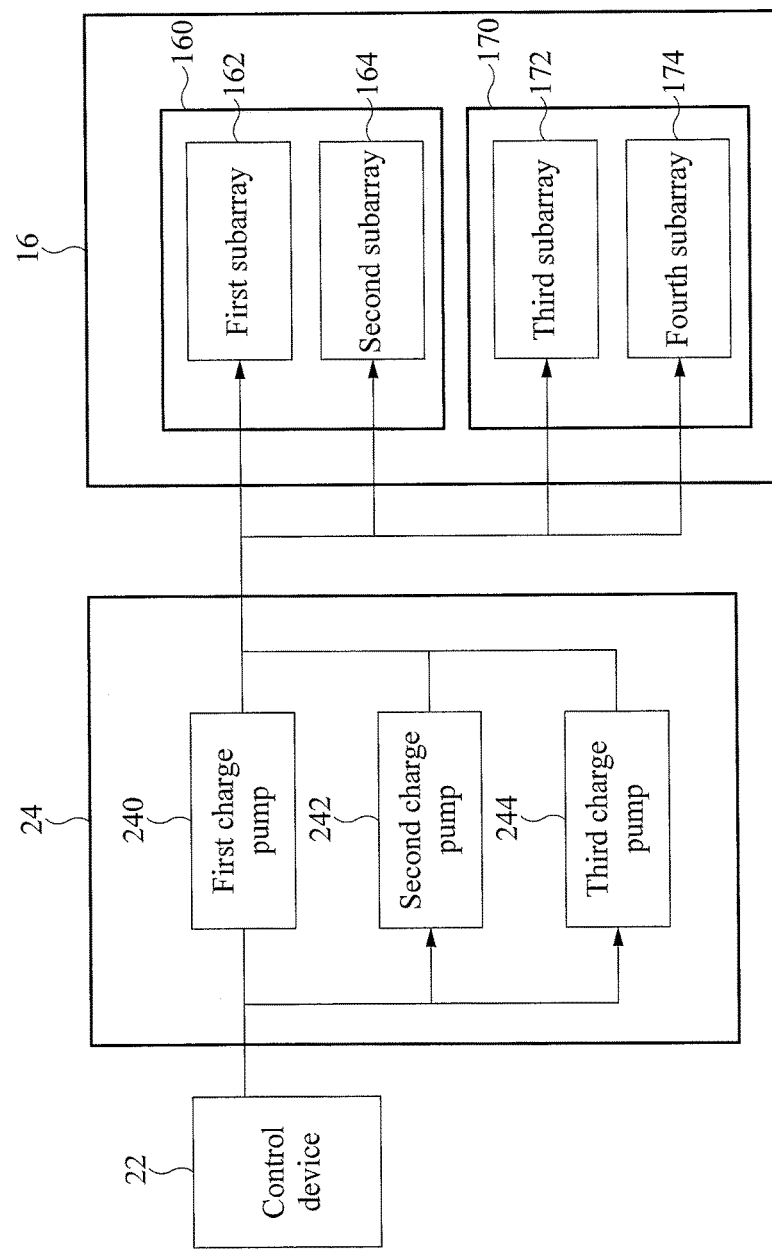
FIG. 5 is a schematic diagram of a dynamic random access memory (DRAM) which includes a control device, in accordance with some embodiments of the present disclosure.

FIG. 5 is a schematic diagram of a dynamic random access memory (DRAM) 20 which includes a control device 22, in accordance with some embodiments of the present disclosure. Referring to FIG. 5, the DRAM 20 is similar to the DRAM 10 described and illustrated with reference to FIG. 1 except that, for example, the DRAM 20 includes the control device 22, and a power source 24 including a first charge pump 240, a second charge pump 242 and a third charge pump 244.

The control device 22 functions to derive information on a quantity of operated subarrays among the first subarray 162, the second subarray 164, the third subarray 172 and the fourth subarray 174.

Moreover, the control device 22 determines how much electrical energy to provide based on the information, as will be described in detail below. In further detail, the control device 22 is able to individually operate the first charge pump 240, the second charge pump 242 and the third charge pump 244 in different manners. For example, the control device 22 is able to enable the first charge pump 240 and the second charge pump 242 while disabling the third charge pump 244. As such, an amount of electrical energy provided by the power source 24 is adjustable and therefore can be managed. As a result, the DRAM 20 is able to provide a function of power management, and usage of electrical energy is relatively efficient. In the present embodiment, the control device 22 is a device within the DRAM 20; however, the present disclosure is not limited thereto. In another embodiment, the control device 22 is a processor of a DRAM controller external to the DRAM 20. In some embodiments, the control device 22 is a combinational logic.

Figure 6:
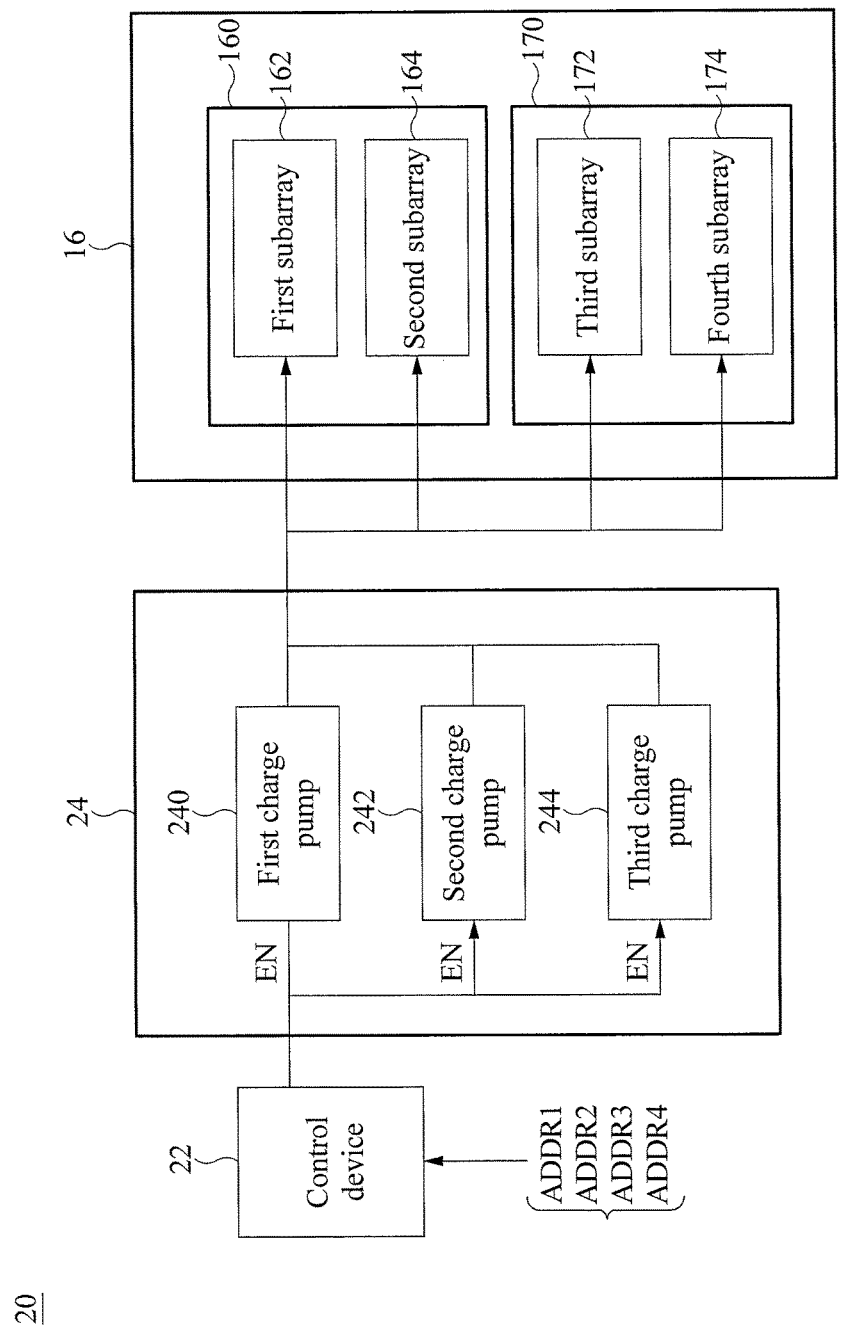
FIG. 6 is a schematic diagram illustrating an operation of the DRAM shown in FIG. 5, in accordance with some embodiments of the present disclosure.
Figure 7:
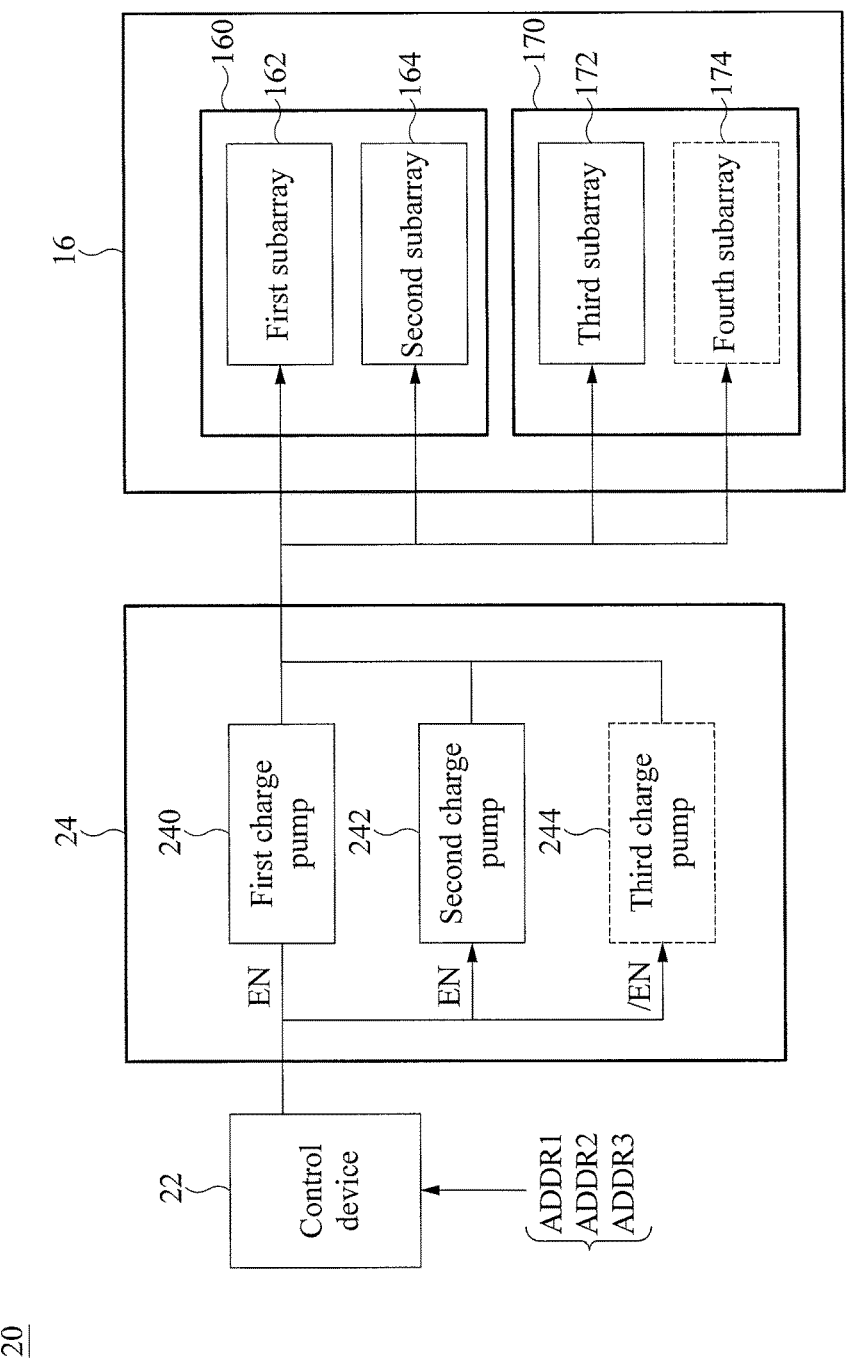
FIG. 7 is a schematic diagram illustrating another operation of the DRAM shown in FIG. 5, in accordance with some embodiments of the present disclosure.
Figure 8:
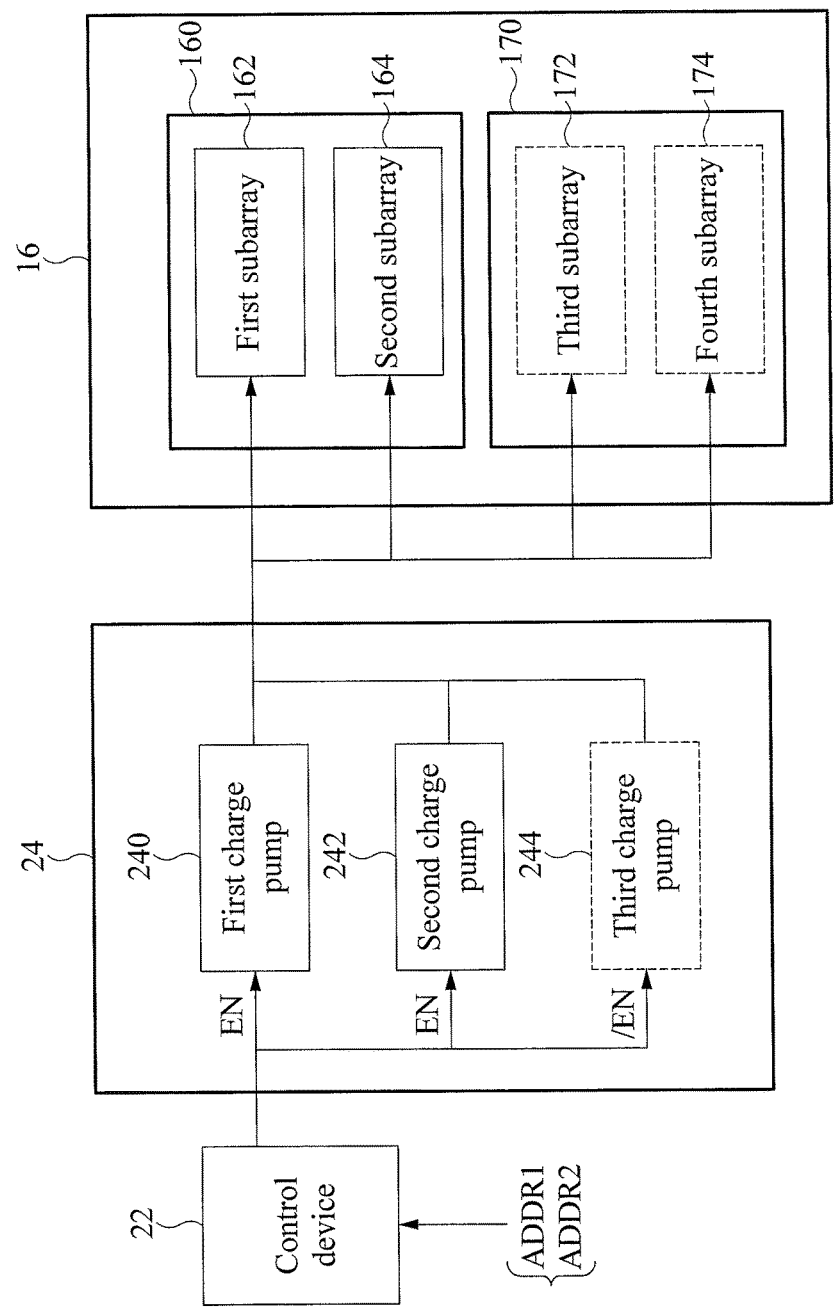
FIG. 8 is a schematic diagram illustrating yet another operation of the DRAM shown in FIG. 5, in accordance with some embodiments of the present disclosure.
Figure 9:
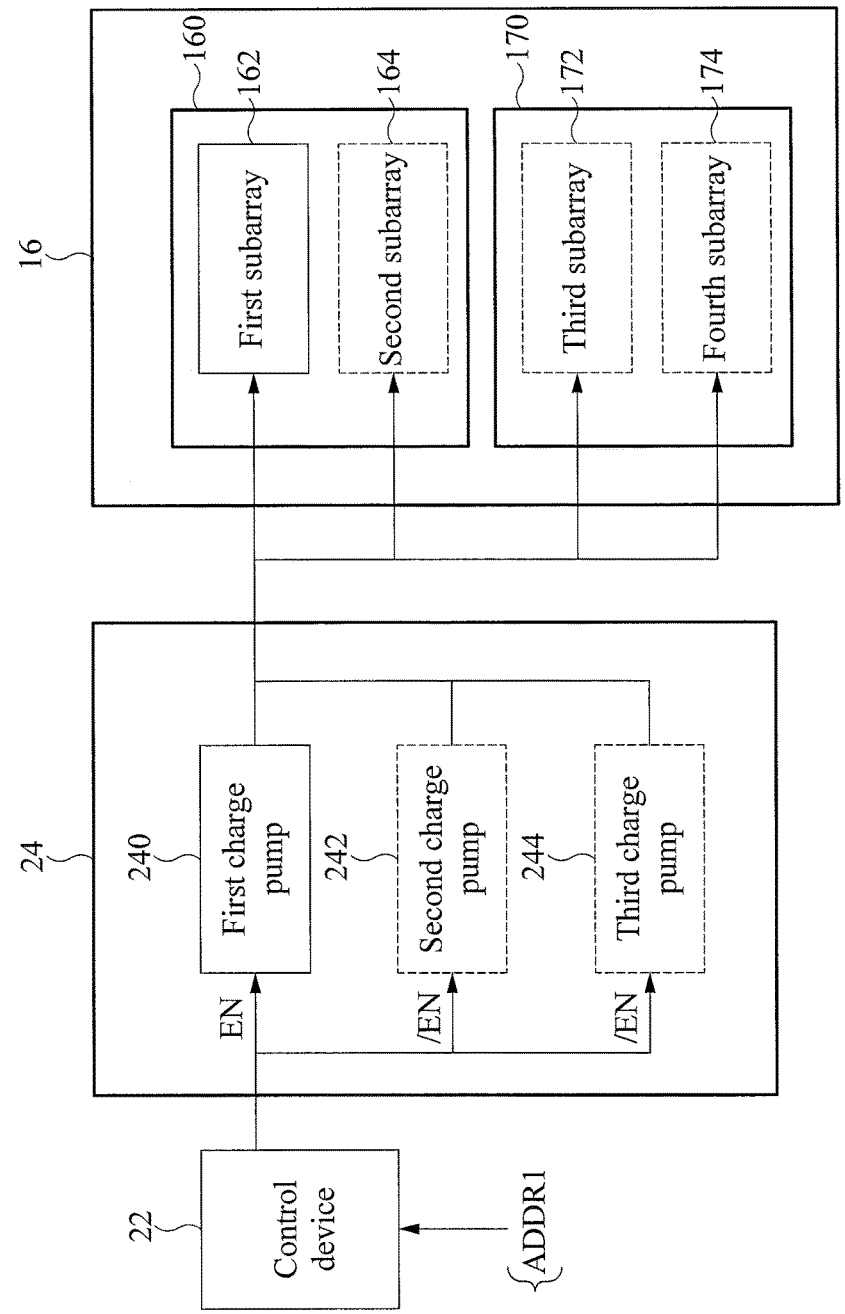
FIG. 9 is a schematic diagram illustrating further yet another operation of the DRAM shown in FIG. 5, in accordance with some embodiments of the present disclosure.

The power source 24 functions to provide the resultant amount of electrical energy based on the determination from the control device 22. For example, the first charge pump 240, the second charge pump 242 and the third charge pump 244 in combination provide a first amount of electrical energy, as shown in FIG. 6. Alternatively, only the first charge pump 240 without either the second charge pump 242 or the third charge pump 244 provides a second amount of electrical energy less than the first amount of electrical energy, as shown in FIG. 9. Further alternatively, the first charge pump 240 and the second charge pump 242 in combination without the third charge pump 244 provide a third amount of electrical energy less than the first amount of electrical energy and greater than the second amount of electrical energy, as shown in FIGS. 7 and 8. In an embodiment, the first charge pump 240, the second charge pump 242 and the third charge pump 244 are independent of each other.

FIG. 6 is a schematic diagram illustrating an operation of the DRAM 20 shown in FIG. 5, in accordance with some embodiments of the present disclosure. Referring to FIG. 6, the first subarray 162, second subarray 164, third subarray 172 and fourth subarray 174 operate. The control device 22 derives information on a quantity of operated subarrays, and the information reflects that the quantity of operated subarrays is 4. The control device 22 determines to provide the first amount of electrical energy, which is a relatively high amount of electrical energy, based on the information reflecting 4. As a result, the control device 22 increases the quantity of enabled charge pumps by enabling all of the first charge pump 240, the second charge pump 242, and the third charge pump 244. The first charge pump 240, the second charge pump 242 and the third charge pump 244 in combination provide the memory array 16 with the resultant amount of electrical energy, i.e. the first amount of electrical energy. The quantity of 4 of the operated subarrays, based on which the control device 22 determines to provide the first amount of electrical energy, only serves as example. Similarly, the quantity of 3 of the enabled charge pumps for providing the first amount of electrical energy only serves as an example. The present disclosure is not limited thereto.

The above statement intends to express that when a quantity of operated subarrays is relatively more, an amount of electrical energy provided by the power source 24 is relatively more.

In an embodiment, the control device 22 functions to receive an address of an operated subarray of an operated bank. The address indicates which subarray of which bank operates. In the embodiment of FIG. 6, the control device 22 receives addresses ADDR1, ADDR2, ADDR3 and ADDR4 respectively for the first subarray 162, the second subarray 164, the third subarray 172 and the fourth subarray 174. The address ADDR1 is located on the first subarray 162, which indicates that the first subarray 162 of the first bank 160 will operate; the address ADDR2 is located on the second subarray 164, which indicates that the second subarray 164 of the first bank 160 will operate, and so on. In an embodiment, the control device 22 includes a table functioning to record addresses of operated subarrays, for example recording addresses ADDR1, ADDR2, ADDR3 and ADDR4 in the present embodiment.

Moreover, the control device 22 derives the information on the quantity of operated subarrays based on the addresses. In further detail, the control device 22, in an embodiment, includes a counter (not shown). The counter functions to count a quantity of the addresses of the operated subarrays. For example, in the present embodiment, the counter counts to a quantity of 4 because it receives four addresses ADDR1, ADDR2, ADDR3 and ADDR4 for the four different subarrays 162, 164, 172 and 174. As such, the control device 22 derives the information based on the counted quantity from the counter.

Additionally, the control device 22, based on a comparison between a quantity ratio of operated subarrays and a ratio range defined by a highest endpoint and a lowest point, determines how much electrical energy to provide. For example, for convenience of discussion, in the following discussion, it is assumed that the lowest endpoint is about 0.25, and the highest endpoint is about 1.

The control device 22 determines that the quantity ratio of (4/4) is equal to the highest endpoint of 1, wherein a denominator of the quantity ratio represents the total quantity of subarrays and a fraction of the quantity ratio represents the quantity of operated subarrays. Therefore, the control device 22 determines to provide the first amount of electrical energy, which is a relatively high amount of electrical energy.

FIG. 7 is a schematic diagram illustrating another operation of the DRAM 20 shown in FIG. 5, in accordance with some embodiments of the present disclosure. The assumption stated in the embodiment of FIG. 6 is followed. Referring to FIG. 7, the first subarray 162, the second subarray 164 and the third subarray 172 operate, while the fourth subarray 174 does not operate. The control device 22 derives information on a quantity of operated subarrays, and the information reflects that the quantity of operated subarrays is 3. The control device 22 determines to provide the third amount of electrical energy, which is a middle amount of electrical energy, based on the information reflecting 3. As a result, the control device 22 enables the first charge pump 240 and the second charge pump 242 while disabling the third charge pump 244. The first charge pump 240 and the second charge pump 242 in combination provide the memory array 16 with the resultant amount of electrical energy, i.e. the third amount of electrical energy.

In an embodiment, the control device 22 receives addresses ADDR1, ADDR2 and ADDR3 respectively for the first subarray 162, the second subarray 164 and the third subarray 172. Since the control device 22 does not receive an address ADDR4 located on the fourth sub array 174, the control device 22 determines that the fourth subarray 174 does not operate. The counter counts to a quantity of 3 since the control device 22 receives addresses ADDR1, ADDR2 and ADDR3 (which reflects that there are three subarrays 162, 164 and 174 to be accessed). As such, the control device 22 derives the information based on the counted quantity of 3. The control device 22 determines that the quantity ratio (3/4) is less than the highest endpoint of 1 and greater than the lowest endpoint of 0.25, and therefore the control device 22 determines to provide the third amount of electrical energy, which is a middle amount of electrical energy.

FIG. 8 is a schematic diagram illustrating yet another operation of the DRAM 20 shown in FIG. 5, in accordance with some embodiments of the present disclosure. The assumption stated in the embodiment of FIG. 6 is still followed. Referring to FIG. 8, the first subarray 162 and the second subarray 164 operate while the third subarray 172 and the fourth subarray 174 do not operate. The control device 22 derives information on a quantity of operated subarrays, and the information reflects that the quantity of operated subarrays is 2. The control device 22 determines to provide the third amount of electrical energy, which is the same amount as that provided in the embodiment of FIG. 7, based on the information reflecting 2. As a result, the control device 22 maintains a same quantity of enabled charge pumps as that in the embodiment of FIG. 7 by enabling the first charge pump 240 and the second charge pump 242 while disabling the third charge pump 244. The first charge pump 240 and the second charge pump 242 in combination provide the memory array 16 with the resultant amount of electrical energy, i.e. the third amount of electrical energy.

In an embodiment, the control device 22 receives addresses ADDR1 and ADDR2 respectively for the first subarray 162 and the second subarray 164. Since the control device 22 does not receive an address ADDR4 located on the fourth sub array 174 and an address ADDR3 located on the third subarray 172, the control device 22 determines that the fourth subarray 174 and the third subarray 172 do not operate. The counter counts to a quantity of 2 since the control device 22 receives addresses ADDR1 and ADDR2 (which reflects that there are two subarrays 162 and 164 to be accessed). As such, the control device 22 derives the information based on the counted quantity of 2. The control device 22 determines that the quantity ratio (2/4) is less than the highest endpoint of 1 and greater than the lowest endpoint of 0.25, and therefore the control device 22 determines to provide the third amount of electrical energy.

FIG. 9 is a schematic diagram illustrating further yet another operation of the DRAM 20 shown in FIG. 5, in accordance with some embodiments of the present disclosure. The assumption stated in the embodiment of FIG. 6 is followed. Referring to FIG. 9, the first subarray 162 operates while the second subarray 164, the third subarray 172 and the fourth subarray 174 do not operate. The control device 22 derives information on a quantity of operated subarrays, and the information reflects that the quantity of operated subarrays is 1. The control device 22 determines to provide the second amount of electrical energy, based on the information reflecting 1. As a result, the control device 22 decreases a quantity of enabled charge pumps by enabling the first charge pump 240 while disabling the second charge pump 242 and the third charge pump 244. Only the first charge pump 240 provides the memory array 16 with the resultant amount of electrical energy, i.e. the second amount of electrical energy.

In an embodiment, the control device 22 receives the address ADDR1 for the first subarray 162. Since the control device 22 does not receive an address ADDR4 located on the fourth sub array 174, an address ADDR3 located on the third subarray 172 and address ADDR2 located on the second subarray 164, the control device 22 determines that the fourth subarray 174, the third subarray 172 and the second subarray 164 do not operate. The counter counts to a quantity of 1 since the control device 22 receives addresses ADDR1 (which reflects that there is one subarray 162 to be accessed). As such, the control device 22 derives the information based on the counted quantity of 1. The control device 22 determines that the quantity ratio (1/4) equals the lowest endpoint of 0.25, and therefore the control device 22 determines to provide the second amount of electrical energy.

From the embodiments of FIGS. 6 to 9, since control device 22 is able to derive information on a quantity of operated subarrays and determines how much electrical energy to provide based on the information, an amount of electrical energy provided by the power source 24 is adjustable and therefore can be managed. As a result, the DRAM 20 is able to provide a function of power management, and usage of electrical energy is relatively efficient. In particular, when a quantity of operated subarrays is relatively low, the power source 24 can provide a relatively low amount of electrical energy. The usage of electrical energy is relatively efficient.

Figure 10:
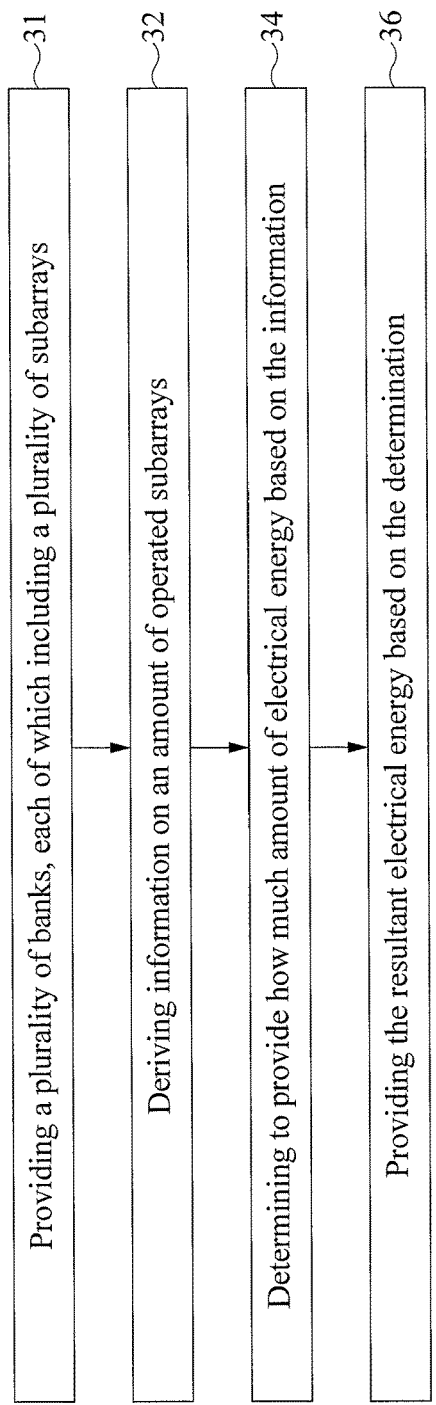
FIG. 10 is a flow diagram illustrating a method of operating a DRAM, in accordance with some embodiments of the present disclosure.

FIG. 10 is a flow diagram illustrating a method 30 of operating a DRAM, in accordance with some embodiments of the present disclosure. Referring to FIG. 10, the method 30 includes operations 31, 32, 34 and 36. The method 30 begins with operation 31, in which a plurality of banks is provided. Each of the banks includes a plurality of subarrays. The bank functions to store data. The method 30 continues with operation 32, in which information on a quantity of operated subarrays is derived. The method 30 proceeds to operation 34, in which it is determined how much electrical energy to provide based on the information. When the quantity of operated subarrays is relatively high, the amount of electrical energy to be provided is relatively large. Subsequent to operation 34, in operation 36, the resultant amount of electrical energy is provided based on the determination. By using the method 30 of the present disclosure, when a quantity of operated subarrays is relatively low, a relatively low amount of electrical energy is provided. The usage of electrical energy is relatively efficient.

Figure 11:
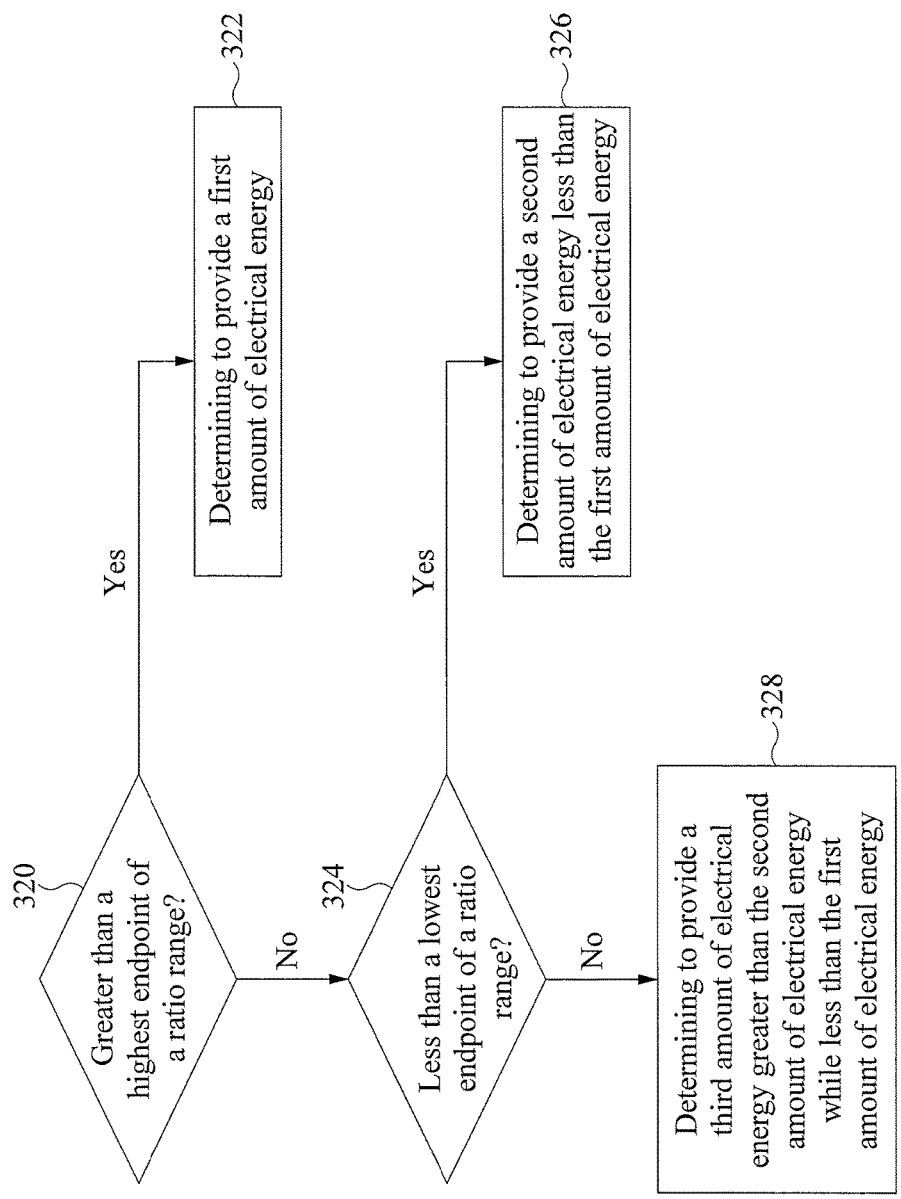
FIG. 11 is a flow diagram illustrating an operation of the method shown in FIG. 10, in accordance with some embodiments of the present disclosure.

FIG. 11 is a flow diagram illustrating operation 32 of the method 30 shown in FIG. 10, in accordance with some embodiments of the present disclosure. Referring to FIG. 11, operation 32 includes operations 320, 322, 324, 326 and 328. Operation 32 begins with operation 320, in which it is determined whether a quantity ratio of operated subarrays among the subarrays is greater than or equal to a highest endpoint of a ratio range. If affirmative, operation 32 proceeds to operation 322, in which it is determined to provide a first amount of electrical energy, which is a relatively high amount of electrical energy. If negative, operation 32 continues with operation 324.

In operation 324, it is determined whether the quantity ratio of operated subarrays is less than or equal to a lowest endpoint of the ratio range. If affirmative, operation 324 proceeds to operation 326. In operation 326, it is determined to provide a second amount of electrical energy less than the first amount of electrical energy. If negative, operation 324 proceeds to operation 328, in which it is determined to provide a third amount of electrical energy greater than the second amount of electrical energy and less than the first amount of electrical energy.

Figure 12:
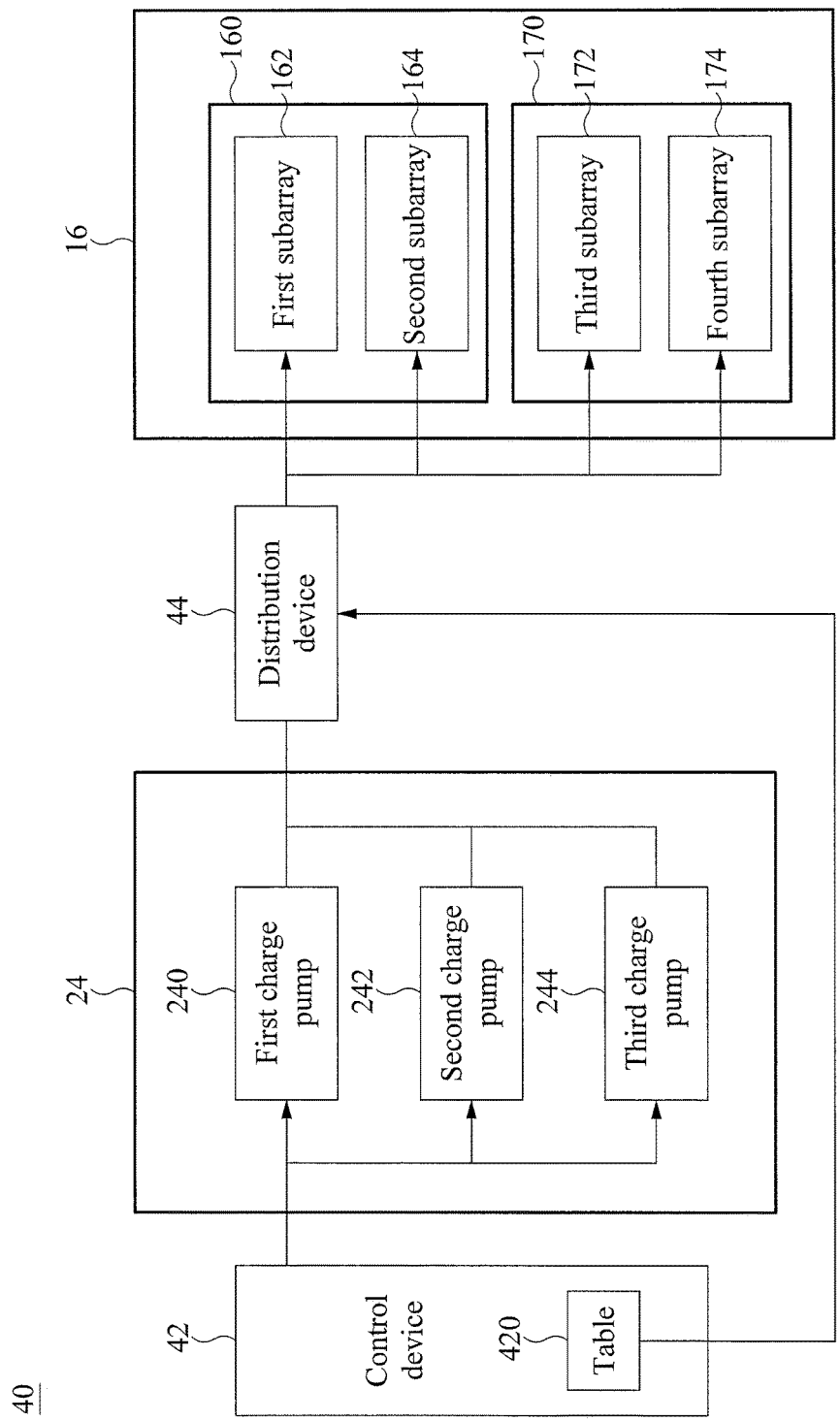
FIG. 12 is a schematic diagram of a dynamic random access memory (DRAM) which further includes a distribution device, in accordance with some embodiments of the present disclosure.

FIG. 12 is a schematic diagram of a dynamic random access memory (DRAM) 40 which further includes a distribution device 44, in accordance with some embodiments of the present disclosure. Referring to FIG. 12, the DRAM 40 is similar to the DRAM 20 described and illustrated with reference to FIG. 5 except that, for example, the DRAM 40 includes the distribution device 44, and a control device 42 including a table 420. As previously mentioned, the table 420 functions to record addresses received. Moreover, the table 420 reflects a quantity of operated subarrays in each bank. For example, referring to FIG. 7, the table 420 associated with the embodiment of FIG. 7 is presented as Table 1 below.

TABLE 1

| | Quantity of operated subarrays |
|---|---|
| Bank 160 | 2 |
| Bank 170 | 1 |

The distribution device 44 functions to distribute the resultant amount of electrical energy to the banks 160 and 170 based on the table 420. In further detail, referring to FIG. 2, the quantity of operated subarrays in the bank 160 is greater than that in the bank 170. Accordingly, the distribution device 44 distributes a greater amount of electrical energy to the first bank 160 than to the second bank 170. In summary, the distribution device 44 distributes the resultant amount of electrical energy to the banks in a manner that the distributed electrical energy of the banks and the quantity of operated subarrays have positive correlation.

Figure 13:
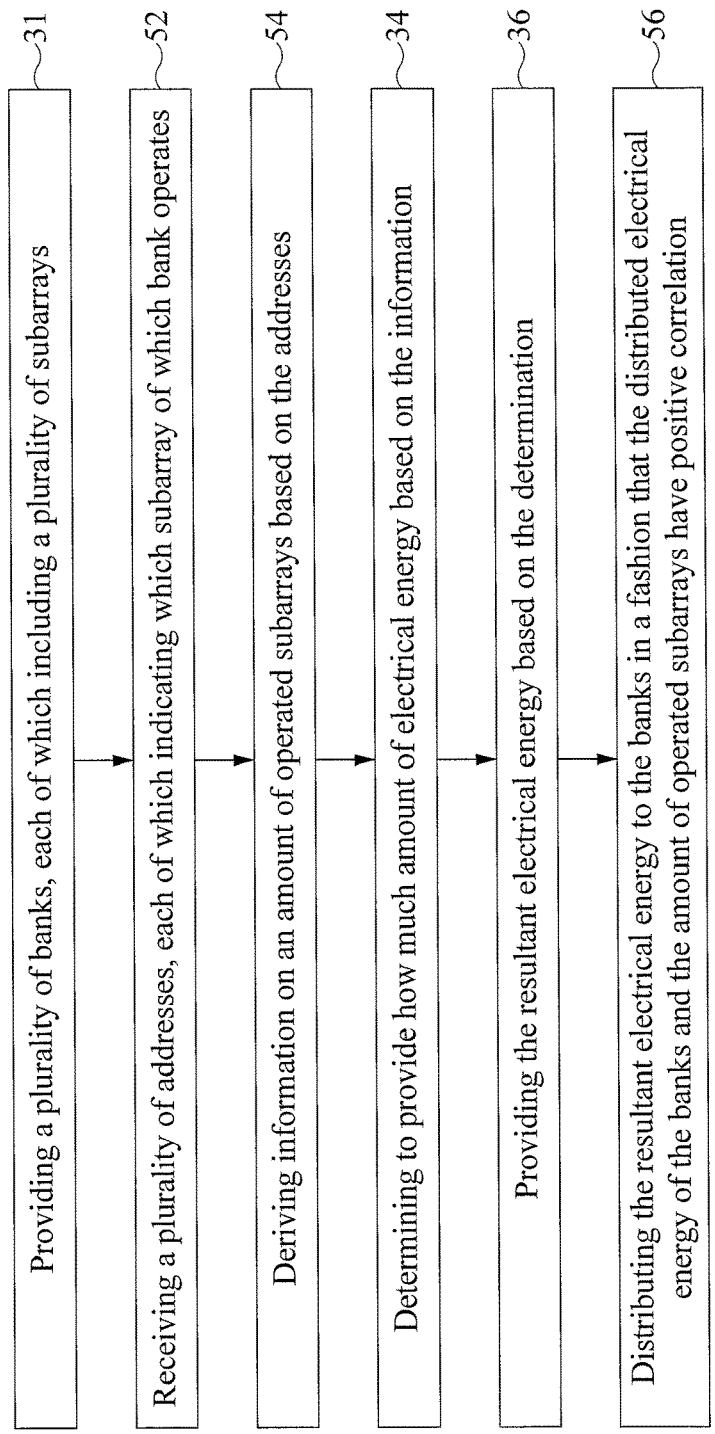
FIG. 13 is a flow diagram illustrating a method of operating a DRAM, in accordance with some embodiments of the present disclosure.

FIG. 13 is a flow diagram illustrating a method 50 of operating a DRAM, in accordance with some embodiments of the present disclosure. Referring to FIG. 13, the method 50 is similar to the method 10 described and illustrated with reference to FIG. 10 except that the method 50 includes operations 52, 54 and 56. In operation 52, a plurality of addresses is received. Each of the addresses indicates which subarray of which bank operates. In operation 54, information on quantity of operated subarrays is derived based on the addresses. In operation 56, the resultant amount of electrical energy is distributed to the banks in a manner that the distributed electrical energy of the banks and the quantity of operated subarrays have positive correlation.

In the present disclosure, the control device 22 functions to derive information on a quantity of operated subarrays, and determines how much electrical energy to provide based on the information. As such, an amount of electrical energy provided by the power source 24 is adjustable and therefore can be managed. As a result, the DRAM 20 is able to provide a function of power management, and usage of electrical energy is relatively efficient. In particular, when the quantity of operated subarrays is relatively low, the power source 24 can provide a relatively low amount of electrical energy. The usage of electrical energy is relatively efficient.

In contrast, in a comparative DRAM 10, the enable device 12 is unable to derive information on a quantity of operated subarrays. Further, the enable device 12 is unable to determine how much electrical energy to provide based on the information. Therefore, an amount of electrical energy provided by all of the first charge pump 140, the second charge pump 142 and the third charge pump 144 is non-adjustable and therefore cannot be managed. As a result, the DRAM 10 is unable to provide a function of power management, and usage of electrical energy is relatively inefficient. In particular, in a circumstance where one or more of the first subarray 160, the second subarray 162, the third subarray 170 and the fourth subarray 172 are not operated, the power source 14 still provides the same electrical energy as that provided in a circumstance where all of the first subarray 160, the second subarray 162, the third subarray 170 and the fourth subarray 172 are operated. That is, the power source 14 provides more electrical energy than the memory 16 requires. The usage of electrical energy is relatively inefficient.

One aspect of the present disclosure provides a DRAM. The DRAM includes a plurality of banks, a power source and a control device. Each of the banks includes a plurality of subarrays. The control device derives information on a quantity of operated subarrays among the subarrays, and determines how much amount energy to provide based on the information. The power source provides the resultant amount of electrical energy based on the determination from the control device.

Another aspect of the present disclosure provides a method. The method includes providing a plurality of banks, each of the banks including a plurality of subarrays; deriving information on a quantity of operated subarrays among the subarrays; determining how much electrical energy to provide based on the information; and providing the resultant amount of electrical energy based on the determination.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A dynamic random access memory (DRAM), comprising:
a plurality of banks, each of the banks including a plurality of subarrays;
a power source; and
a control device configured to derive information on a quantity of operated subarrays among the subarrays, and determine how much electrical energy to provide based on the information,
wherein the power source provides the resultant amount of electrical energy based on the determination from the control device;
wherein the control device determines to provide a first amount of electrical energy when a quantity ratio of the operated subarrays is greater than or equal to a highest endpoint of a ratio range, and provide a second amount of electrical energy less than the first amount of electrical energy when the quantity ratio of the operated subarrays is less than or equal to a lowest endpoint of the ratio range.

2. The DRAM of claim 1, wherein the control device determines to provide a third amount of electrical energy greater than the second amount of electrical energy and less than the first amount of electrical energy when the quantity ratio of the operated subarrays is less than the highest endpoint of the ratio range and greater than the lowest endpoint of the ratio range.

3. The DRAM of claim 1, wherein the power source includes a plurality of charge pumps independent of each other, wherein the control device increases a quantity of enabled charge pumps among the charge pumps when the control device determines to provide the first amount of electrical energy.

4. The DRAM of claim 3, wherein when each of the charge pumps is enabled, each of the charge pumps provides the same amount of electrical energy.

5. The DRAM of claim 1, wherein the power source includes a plurality of charge pumps independent of each other,
wherein the control device decreases a quantity of enabled charge pumps among the charge pumps when the control device determines to provide the second amount of electrical energy.

6. The DRAM of claim 1, wherein the control device receives a plurality of addresses, each of which indicates which subarray is operated,
wherein the control device is configured to derive the information on the quantity of the operated subarrays based on the addresses.

7. The DRAM of claim 6, further comprising:
a counter configured to count a quantity of the addresses of the operated subarrays,
wherein the control device derives the information on the quantity of the operated subarrays based on the quantity from the counter.

8. The DRAM of claim 6, further comprising:
a distribution device configured to distribute the resultant amount of electrical energy to the banks including the operated subarrays in a manner that the distributed electrical energy provided to banks including the operated subarrays among the banks and the quantity of the operated subarrays have a positive correlation.

9. The DRAM of claim 8, wherein the control device includes a table configured to record the addresses, and the distribution device distributes the resultant amount of electrical energy based on the addresses recorded in the table.

10. The DRAM of claim 1, wherein the control device includes a combinational logic.

11. A method, comprising:
providing a plurality of banks, each of the banks including a plurality of subarrays;
deriving information on a quantity of operated subarrays among the subarrays;
determining how much electrical energy to provide based on the information; and
providing the resultant amount of electrical energy based on the determination,
wherein the determining how much electrical energy to provide based on the information includes:
determining to provide a first amount of electrical energy when a quantity ratio of the operated subarrays is greater than or equal to a highest endpoint of a ratio range; and
determining to provide a second amount of electrical energy less than the first amount of electrical energy when the quantity ratio of the operated subarrays is less than or equal to a lowest endpoint of the ratio range.

12. The method of claim 11, wherein the determining how much electrical energy to provide based on the information includes:
determining to provide a third amount of electrical energy greater than the second amount of electrical energy and less than the first amount of electrical energy when the quantity ratio of the operated subarrays is less than the highest endpoint of the ratio range and greater than the lowest endpoint of the ratio range.

13. The method of claim 11, further comprising:
providing a plurality of charge pumps,
wherein the determining to provide the first amount of electrical energy when the quantity ratio of the operated subarrays is greater than or equal to the highest endpoint of a ratio range includes:
determining to increase a quantity of enabled charge pumps among the charge pumps.

14. The method of claim 11, further comprising:
providing a plurality of charge pumps,
wherein the determining to provide the second amount of electrical energy less than the first amount of electrical energy when the quantity ratio of the operated subarrays is less than or equal to a lowest endpoint of the ratio range includes:
determining to decrease a quantity of enabled charge pumps among the charge pumps.

15. The method of claim 11, further comprising:
receiving a plurality of addresses, each of which indicates which subarray is operated,
wherein the deriving information on the quantity of operated subarrays among the subarrays includes:
deriving the information on the amount of the operated subarrays based on the addresses.

16. The method of claim 15, further comprising:
counting a number of the addresses of the operated subarrays,
wherein the deriving the information on the amount of the operated subarrays based on the addresses includes:
deriving the information on the amount of the operated subarrays based on the number.

17. The method of claim 15, further comprising:
distributing the resultant amount of electrical energy to the banks including the operated subarrays in a manner that the distributed electrical energy provided to banks including the operated subarrays among the banks and the amount of the operated subarrays have a positive correlation.

18. The method of claim 17, further comprising:
recording the addresses, and
wherein the distributing the resultant amount of electrical energy to the banks including the operated subarrays includes:
distributing the resultant amount of electrical energy based on the addresses recorded.

* * * * *